(12) United States Patent
Namba et al.

(10) Patent No.: US 7,362,076 B2
(45) Date of Patent: Apr. 22, 2008

(54) REMAINING CAPACITY CALCULATING DEVICE AND METHOD FOR ELECTRIC POWER STORAGE

(75) Inventors: Atsushi Namba, Tokyo (JP); Mikio Ono, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 73 days.

(21) Appl. No.: 11/389,098

(22) Filed: Mar. 27, 2006

(65) Prior Publication Data

US 2006/0220619 A1   Oct. 5, 2006

(30) Foreign Application Priority Data

Mar. 29, 2005  (JP)  .......................... P.2005-095897

(51) Int. Cl.
   *H01M 10/44*   (2006.01)
   *H01M 10/46*   (2006.01)
(52) U.S. Cl. ..................................... 320/149
(58) Field of Classification Search ............... 320/132, 320/149, 150; 324/426, 430, 433; 340/635, 340/636.1, 636.12, 636.13, 636.18
   See application file for complete search history.

(56) References Cited

U.S. PATENT DOCUMENTS 6,845,332 B2   1/2005  Teruo ........................... 702/63

2003/0097225 A1   5/2003  Teruo ........................... 702/63

FOREIGN PATENT DOCUMENTS

| JP | 6-242193 | 9/1994 |
| JP | 8-179018 | 7/1996 |
| JP | 11-223665 | 8/1999 |
| JP | 2003-1493078 | 5/2003 |

OTHER PUBLICATIONS

Extended Search Report issued in EU Pat. App. No. 06006416.9-2216 dated Jul. 21, 2006.

*Primary Examiner*—Edward H Tso
(74) *Attorney, Agent, or Firm*—Smith, Gambrell & Russell, LLP

(57) ABSTRACT

It calculates a capacity difference ESOC between a reference remaining capacity SOCV based on an open-circuit voltage and a final remaining capacity SOC in a previous one calculation cycle. It calculates a proportional correction amount and an integral correction amount according to a proportional-integral control by using this capacity difference ESOC, and requires a final remaining capacity SOC by adding a remaining capacity SOCI based on a current integration to these correction amounts. Thus, while making good use of the remaining capacity based on the battery open-circuit voltage, it can avoid the influence of the load fluctuation and require a remaining capacity always stable and accurate.

16 Claims, 7 Drawing Sheets

FIG. 8

| TB\TKΔIM/Δt | 0 | 5 | 10 | 40 | 50 |
|---|---|---|---|---|---|
| -30 | *.**** | *.**** | *.**** | *.**** | *.**** |
| -20 | *.**** | *.**** | *.**** | *.**** | *.**** |
| -10 | *.**** | *.**** | *.**** | *.**** | *.**** |
| 0 | *.**** | *.**** | *.**** | *.**** | *.**** |
| 10 | *.**** | *.**** | *.**** | *.**** | *.**** |
| 25 | 0.0057 | 0.0057 | 0.0035 | 0.0032 | 0.0031 |
| 40 | *.**** | *.**** | *.**** | *.**** | *.**** |
| 50 | *.**** | *.**** | *.**** | *.**** | *.**** |

FIG. 9

| TB\SOCV (%) | 0 | 10 | 20 | 30 | 40 | 50 | 60 | 70 | 80 | 90 | 100 |
|---|---|---|---|---|---|---|---|---|---|---|---|
| -30 | *.* | *.* | *.* | *.* | *.* | *.* | *.* | *.* | *.* | *.* | *.* |
| -20 | *.* | *.* | *.* | *.* | *.* | *.* | *.* | *.* | *.* | *.* | *.* |
| -10 | *.* | *.* | *.* | *.* | *.* | *.* | *.* | *.* | *.* | *.* | *.* |
| 0 | *.* | *.* | *.* | *.* | *.* | *.* | *.* | *.* | *.* | *.* | *.* |
| 10 | *.* | *.* | *.* | *.* | *.* | *.* | *.* | *.* | *.* | *.* | *.* |
| 25 | *.* | *.* | *.* | *.* | *.* | 298.96 | 308.81 | 317.21 | 324.31 | *.* | *.* |
| 40 | *.* | *.* | *.* | *.* | *.* | *.* | *.* | *.* | *.* | *.* | *.* |
| 50 | *.* | *.* | *.* | *.* | *.* | *.* | *.* | *.* | *.* | *.* | *.* |

VOC

REMAINING CAPACITY CALCULATING DEVICE AND METHOD FOR ELECTRIC POWER STORAGE

The present application claims foreign priority based on Japanese Patent Application No. P.2005-095897, filed on Mar. 29, 2005, the contents of which are incorporated herein by reference.

BACKGROUND OF THE INVENTION

1. Field of the Invention

The present invention relates to a remaining capacity calculating device and method for electric power storage which calculates the remaining capacity of an electric power storage such as a secondary battery and an electrochemical capacitor.

2. Related Art

These days, the electric power storages including a secondary battery such as nickel hydride battery and lithium-ion battery and an electrochemical capacitor such as electric double layer capacitor have been improved in downsizing and high energy density, and frequently used as the power source of various devices ranging from an information communication unit like a cell phone to an electric vehicle and a hybrid car.

In order to make an effective use of the electric power storage, it is important to recognize its remaining capacity accurately, and a technique of requiring the remaining capacity according to the calculation of charge/discharge currents of an electric power storage and a technique of requiring it according to an open-circuit voltage have been known.

For example, JP-A-06-242193 discloses a technique of requiring the remaining capacity at a halt time according to an open-circuit voltage obtained from a battery voltage at a stop of a electric vehicle, detecting a discharge electric capacity according to the integrated value of the discharge current of a battery, calculating the full charged amount according to this discharge electric capacity and the remaining capacity at the stop, and requiring the remaining capacity according to this full charged amount and the discharge electric capacity.

JP-A-08-179018 discloses a technique of requiring the remaining capacity according to the current integrated amount during a certain time period of charge and discharge, the voltage before discharge or charge, and the voltage after discharge or charge, in a battery having a linear proportional relation between battery capacity and battery voltage, like a lithium-ion battery.

JP-A-11-223665 discloses a technique of correcting a calculation method of the remaining capacity, according to the remaining capacity obtained by integrating the charge/discharge current of a battery and a change rate of a difference between the above remaining capacity and the remaining capacity assumed based on the open-circuit terminal voltage of the battery.

However, the technique of requiring the remaining capacity by adding up the charge/discharge currents and the technique of requiring it according to an open-circuit voltage have each good and bad points. The former is tough to load fluctuation caused by incoming current and it can get the stable remaining capacity, however, it has a drawback that there may occur accumulation of errors easily (error becomes enormous, in particular, at a time of continuous high load), while although the latter can get the accurate value in a current stable region, it has a drawback that the calculated value changes easily when a load changes rapidly and drastically.

Therefore, even a combination of the both techniques, like JP-A-06-242193, JP-A-08-179018 and JP-A-11-223665, cannot eliminate the accumulation of errors through the current integration. In a continuous charge/discharge state like a hybrid car, in particular, there is a fear that the calculation accuracy of the remaining capacity is deteriorated and the calculated value of the remaining capacity rapidly changes and it is difficult to secure the stable accuracy.

SUMMARY OF THE INVENTION

One or more embodiments of the present invention provide a device and method for calculating a remaining capacity of an electric power storage which can always require a stable and accurate remaining capacity according to the open-circuit voltage of the electric power storage, avoiding the influence of load fluctuation.

In accordance with one or more embodiments of the present invention, a remaining capacity calculating device for electric power storage is provided with: a reference remaining capacity calculating unit that calculates a remaining capacity based on an open-circuit voltage of an electric power storage as a reference remaining capacity; a capacity difference calculating unit that calculates a capacity difference between the reference remaining capacity calculated by the reference remaining capacity calculating unit and a remaining capacity finally calculated as a remaining capacity of the electric power storage; a proportional-integral controlling unit that calculates a proportional correction amount and an integral correction amount of a proportional-integral control with the reference remaining capacity as a target value, according to the capacity difference; and a remaining capacity calculating unit that calculates the final remaining capacity of the electric power storage, according to the proportional correction amount and the integral correction amount calculated by the proportional-integral controlling unit.

Further, in the device, the remaining capacity calculating unit may add a remaining capacity based on an integrated value of charge/discharge currents of the electric power storage to the proportional correction amount and the integral correction amount, and may calculate the final remaining capacity of the electric power storage.

Further, in the device, the proportional-integral controlling unit may calculate the proportional correction amount by multiplying the capacity difference by a coefficient based on a current change rate of the charge/discharge currents of the electric power storage and temperature.

In accordance with one or more embodiments of the present invention, a remaining capacity calculating method is provided with the steps of: calculating a reference remaining capacity based on an open-circuit voltage; calculating a capacity difference between the reference remaining capacity and a remaining capacity finally calculated as a remaining capacity of the electric power storage; calculating a proportional correction amount and an integral correction amount of a proportional-integral control with the reference remaining capacity as a target value, according to the capacity difference; and calculating the final remaining capacity of the electric power storage, according to the proportional correction amount and the integral correction amount.

In addition, the method may further provided with the step of: adding a remaining capacity based on an integrated value of charge/discharge currents of the electric power storage to the proportional correction amount and the integral correction amount.

Further, in the method, the proportional correction amount is calculated by multiplying the capacity difference by a coefficient based on a current change rate of the charge/discharge currents of the electric power storage and temperature.

According to the remaining capacity calculating device and method for electric power storage of one or more embodiments of the present invention, a remaining capacity can be calculated, always stably and accurately without an influence of load fluctuation, based on the open-circuit voltage of the electric power storage.

Other aspects and advantages of the invention will be apparent from the following description and the appended claims.

BRIEF DESCRIPTION OF THE DRAWINGS

FIG. 8 is a view for use in describing the impedance table.

FIG. 9 is a view for use in describing the reference remaining capacity table.

DESCRIPTION OF THE PREFERRED EMBODIMENTS

Embodiments of the invention will be described with reference to the accompanying drawings.

Figure 1:
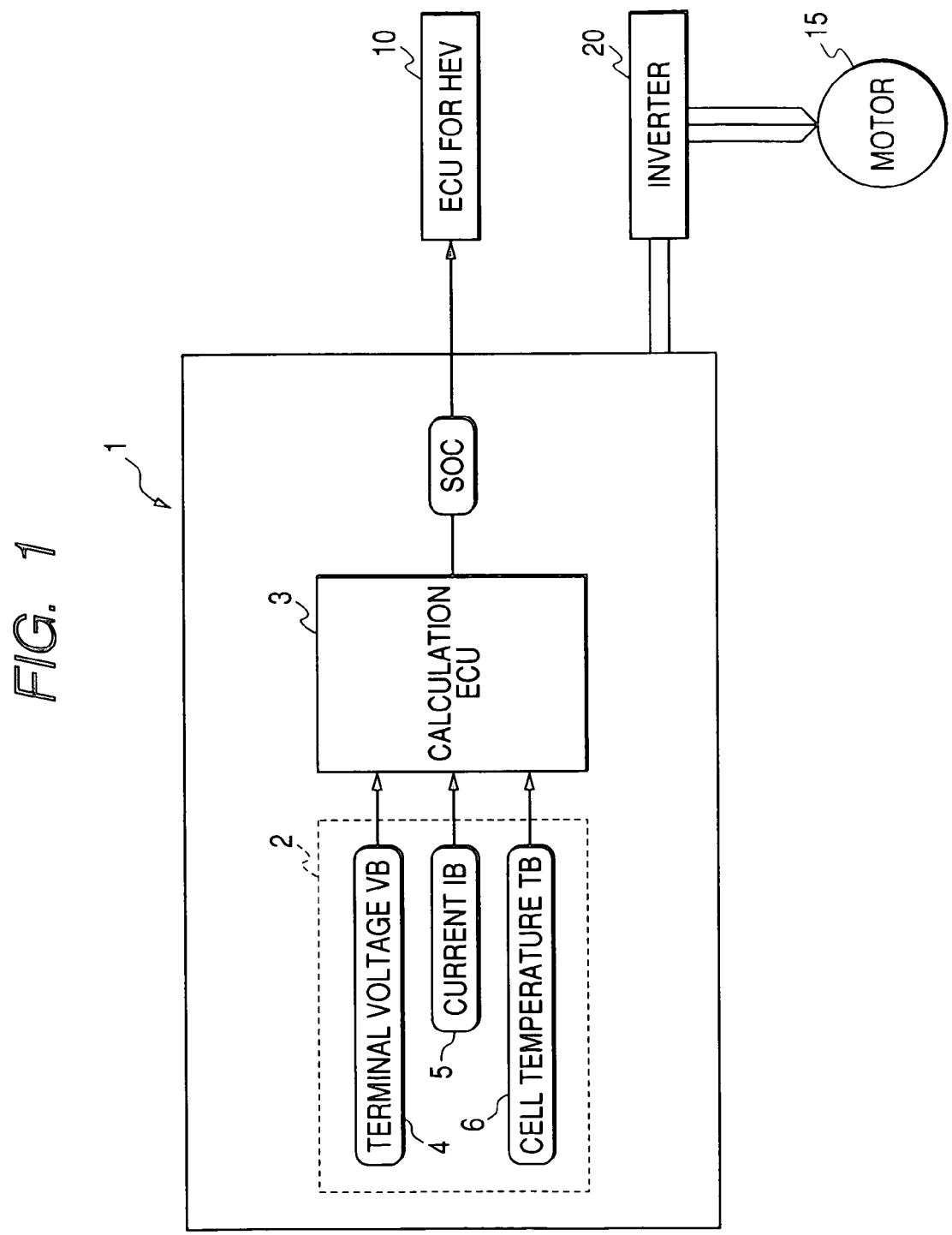
FIG. 1 is a structural view showing an exemplary embodiment in which an embodiments of the invention is applied to a hybrid car.
Figure 2:
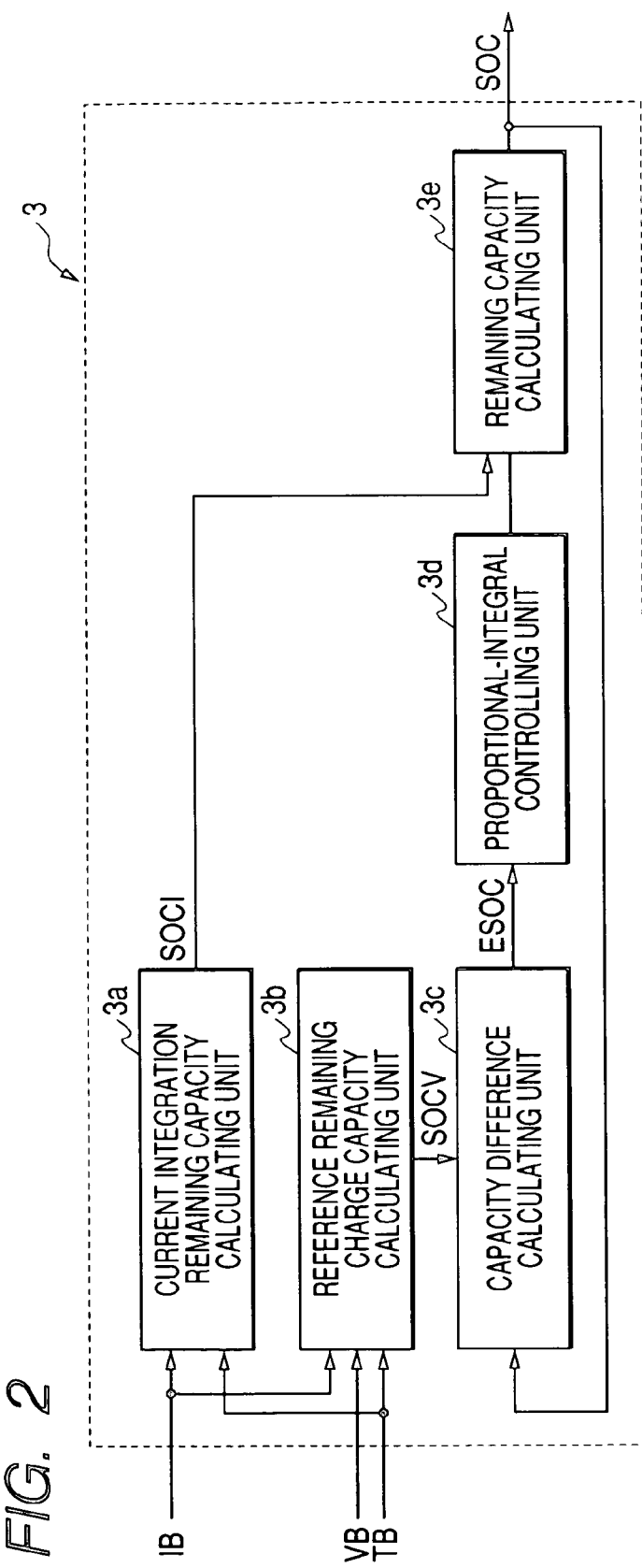
FIG. 2 is a block diagram showing the estimate algorithm of the battery remaining capacity.
Figure 3:
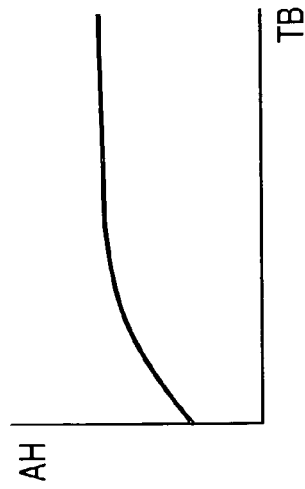
FIG. 3 is a view for use in describing the relationship between the battery capacity and the temperature.
Figure 4:
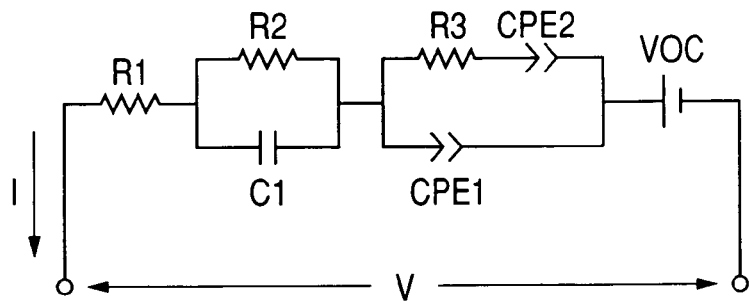
FIG. 4 is a circuit diagram showing the equivalent circuit model of the battery.
Figure 5:
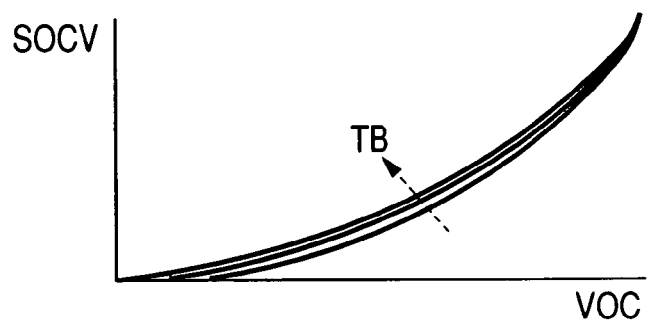
FIG. 5 is a view for use in describing the relationship between the reference remaining capacity and the open-circuit voltage.
Figure 6:
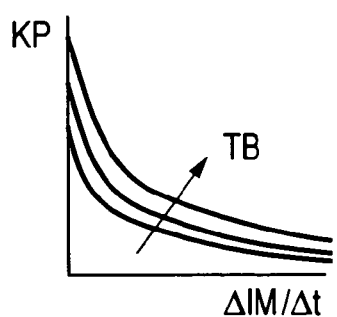
FIG. 6 is a view for use in describing the characteristic of the proportional coefficient.
Figure 7:
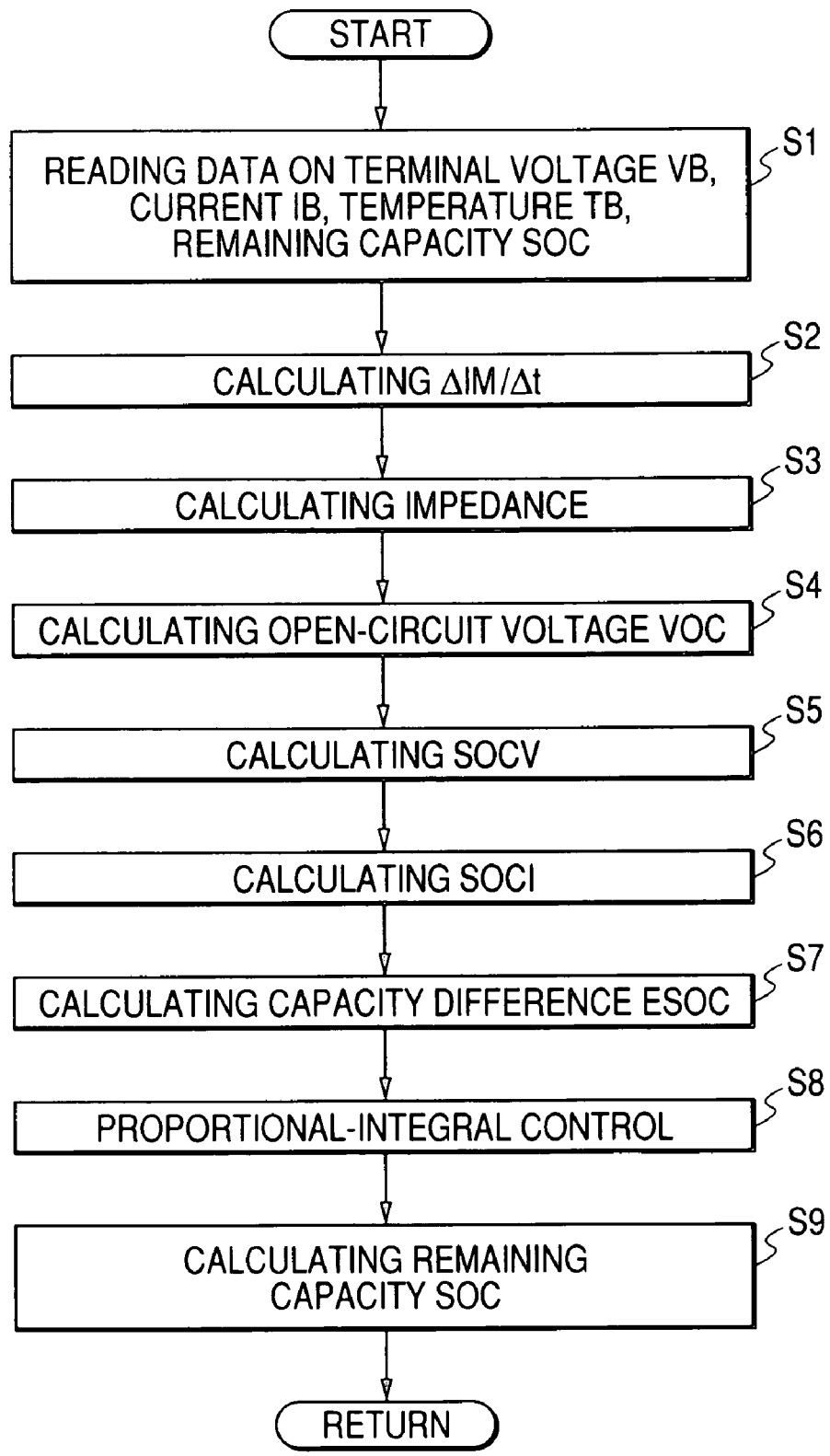
FIG. 7 is a flow chart of the remaining capacity calculation processing.
Figure 10:
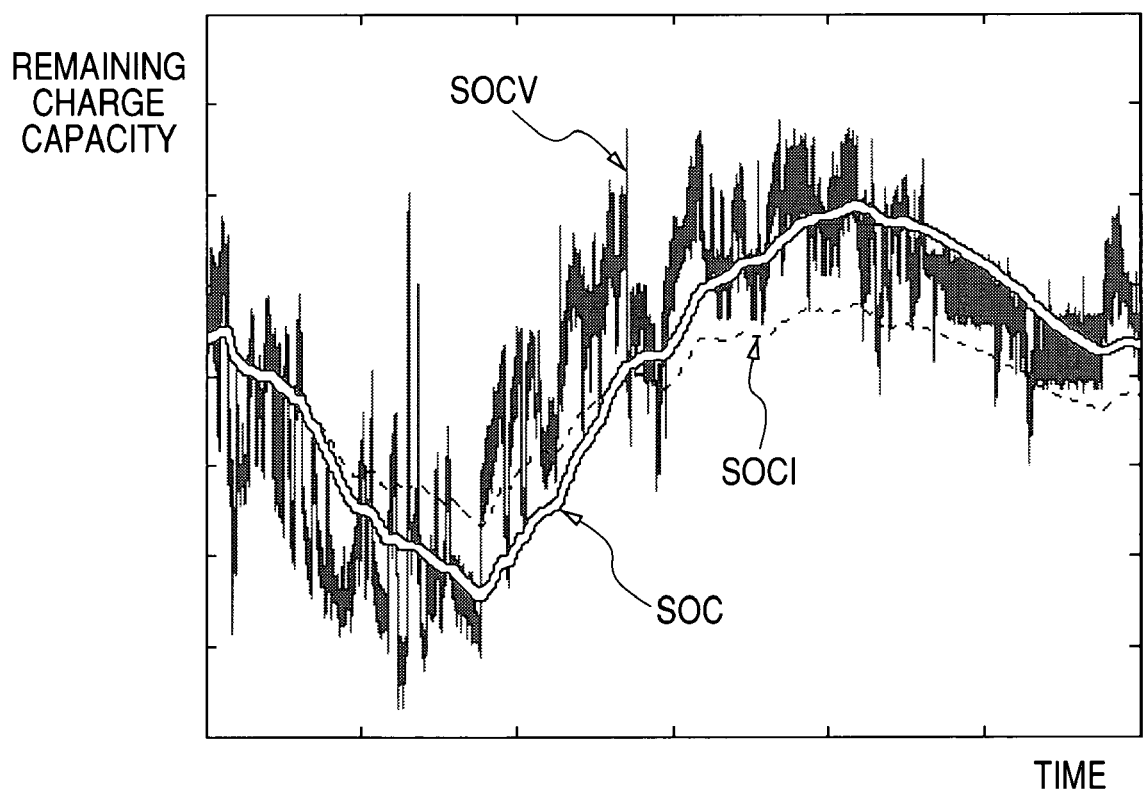
FIG. 10 is a view for use in describing the final remaining capacity based on the remaining capacity including the constant current errors and the reference remaining capacity.

FIGS. 1 to 10 are concerned with the embodiments of the invention: FIG. 1 is a system structural view in which an exemplary embodiment is applied to a hybrid car; FIG. 2 is a block diagram showing an estimate algorithm of the battery remaining capacity; FIG. 3 is an explanatory view showing the relationship between the battery capacity and the temperature; FIG. 4 is a circuit diagram showing an equivalent circuit model of a battery; FIG. 5 is an explanatory view showing the relationship between the reference remaining capacity and the open-circuit voltage; FIG. 6 is an explanatory view showing the characteristics of a proportional coefficient; FIG. 7 is a flow chart of the remaining capacity calculation processing; FIG. 8 is an explanatory view of an impedance table; FIG. 9 is an explanatory view of a table of reference remaining capacity; and FIG. 10 is an explanatory view showing the remaining capacity including the constant current error and the final remaining capacity according to the reference remaining capacity.

FIG. 1 shows an example in which exemplary embodiment of the invention is applied to a hybrid electric vehicle (HEV) running in combination of an engine and a motor. In FIG. 1, a reference numeral 1 is a power supply unit of the HEV. The power supply unit 1 includes a battery 2 formed by a plurality of battery packs sealing a plurality of cells, for example, as an electric power storage, connected in series, and a calculation unit (calculation ECU) 3 which calculates the remaining capacity of the battery 2, controls cooling and charge of the battery 2, and performs the energy management such as abnormal detection and a protection operation at the abnormal detection, within one package.

In the embodiment, although the description will be made by taking, by way of example, a rechargeable lithium-ion battery as an electric power storage, the calculation method of remaining capacity according to the invention can be applied to an electrochemical capacitor and the other secondary battery.

The calculation ECU 3 is formed by a microcomputer, which calculates the remaining capacity SOC expressed by the state of charge (State of charge: SOC) of the battery 2, according to the terminal voltage VB of the battery 2 measured by a voltage sensor 4, the charge/discharge current IB of the battery 2 measured by a current sensor 5, and the temperature (cell temperature) TB of the battery 2 measured by a temperature sensor 6, in predetermined intervals of time. The remaining capacity SOC is supplied, for example, from the calculation ECU 3 of the power supply unit 1 to an electric control unit for HEV (ECU for HEV) 10 through CAN (Controller Area Network) communication and used as the basic data for vehicle control and the data for display of the battery remaining amount and alarming.

The ECU for HEV 10 is formed by a microcomputer similarly, which performs a necessary control on the operation of the HEV according to an instruction from an operator. Namely, the ECU for HEV 10 detects the state of a vehicle according to a signal from the power supply unit 1 or a signal from a sort of sensor/switch not illustrated, and controls not only an inverter 20 which converts the DC power of the battery 2 into the AC power to drive a motor 15 but also an engine and an automatic transmission, not illustrated, directly or through an exclusive control unit.

Calculation of the remaining capacity SOC in the calculation ECU 3 is performed according to the estimate algorithm shown in the block diagram of FIG. 2. This estimate algorithm is intended for the remaining capacity SOCV calculated based on the open-circuit voltage VOC of a battery and it calculates the final remaining capacity SOC of the battery 2 through a proportional-integral control with this remaining capacity SOCV used as a target value. Hereinafter, the remaining capacity based on the open-circuit voltage of the battery is properly referred to as "reference remaining capacity".

Generally, as a technique of calculating the remaining capacity of a battery, there is a technique of acquiring the remaining capacity according to the integrated value of the battery current and a technique of acquiring the remaining capacity according to the open-circuit voltage of the battery and they both have each good and bad points. In the former, while it is tough to load fluctuations caused by incoming current, it is able to obtain the stable remaining capacity. It also has a drawback that there may occur accumulation of current errors easily (error becomes enormous, in particular, at a time of continuous high load). While the latter can get the accurate value in a current stable region, it has, however, a drawback that the calculated value of the remaining capacity easily changes since it cannot get an accurate impedance at a time of estimating an open-circuit voltage when a load changes rapidly and drastically.

The calculation ECU 3 is designed to feed back a difference between the reference remaining capacity SOCV and the final remaining capacity SOC based on the battery open-circuit voltage VOC according to the proportional-integral control, hence to require the stable remaining capacity even when a load fluctuates, while securing the accuracy in a current stable region. In the embodiment, the proportional-integral control of the reference remaining capacity SOCV is mainly used and the remaining capacity based on the current integration is added in a feed-forward way, hence to secure the response ability to the load fluctuation.

In each function of forming the SOC estimate algorithm, the calculation ECU 3 comprises a current integration remaining capacity calculating unit 3a which calculates the remaining capacity SOCI based on the current integration, a reference remaining capacity calculating unit 3b as reference remaining capacity calculating means which calculates the reference remaining capacity SOCV based on the open-circuit voltage VOC, a capacity difference calculating unit 3c as capacity difference calculating means which calculates a capacity difference ESOC between the final remaining capacity SOC and the reference remaining capacity SOCV as a target value, a proportional-integral controlling unit 3d as proportional-integral controlling means which calculates the proportional correction amount and the integral correction amount of the proportional-integral control based on the capacity difference ESOC, and a remaining capacity calculating unit 3e as remaining capacity calculating means which calculates the final remaining capacity SOC of the battery 2.

More specifically, the remaining capacity SOCI based on the current integration can be required according to the following (1) by using the initial value SOCI(0) as the base value through the battery current IB.

$$SOCI=SOCI(0)-\int[(100\times\eta\times I\ B/AH)+SD]d\ t/3600 \quad (1)$$

where,

η: current efficiency
AH: current capacity (variable by temperature)
SD: self-discharge rate The current efficiency η and the self-discharge rate SD are respectively regarded as a constant in the lithium-ion battery of the embodiment and practically, they are η=1 and SD=0. Since the formula (1) represented by the continuous time series is calculated in the periodical calculation processing, it is made discrete by the calculation cycle DLTT in every sampling time k and simplified into the following formula (1'). Where, the initial value SOCI(0) is set to be the reference remaining capacity SOCV read at a system activation.

$$SOCI(k)=SOCI(k-1)-IB(k)/(AH\times3600)\times DLTT \quad (1')$$

The current capacity AH of the battery changes depending on the temperature, as illustrated in FIG. 3, and the battery capacity is decreased according as the temperature becomes lower. After a table, for example, with the temperature TB as parameter, is created, the current capacity AH is calculated referring to the table.

While, as for the reference remaining capacity SOCV based on the open-circuit voltage VOC of the battery, an accurate calculated value is obtained by grasping the internal state of the battery electrochemically according to the battery theory. In order to require this reference remaining capacity SOCV, at first, the internal impedance Z of the battery is required by using the equivalent circuit model shown in FIG. 4.

The equivalent circuit shown in FIG. 4 is an equivalent circuit model with each parameter for R1 to R3 and each parameter for capacity C1, CPE1, and CPE2 (where, CPE1 and CPE2 are for double layer capacity) combined in series and in parallel, and each parameter is determined by curve-fitting the known Cole-Cole plot in an alternative current impedance method.

The impedance Z required from the parameters dramatically changes according to the temperature of the battery, electrochemical reaction speed, and frequency component of charge/discharge current. Therefore, as a parameter which reflects the charge/discharge state of the battery, the change rate of current is used in order to determine the impedance Z. Although the current change rate directly reflects the load fluctuation of the battery, a simple current change rate would receive an influence of spikes rapidly changing. Though the influence by the spikes can be moderated through the processing of the simple average, moving average, and weighted average of the predetermined sampling number, in particular, when considering the delay of current, the use of the moving average is preferable which can reflect the history charge/discharge state of the battery properly not excessively as for a change in the charge/discharge state.

When the moving average of the battery current is defined as IM, the current change rate $\Delta IM/\Delta t$ in the time t of the moving average IM is adopted as a replacement for the frequency component, and after the data is accumulated through the impedance measurement under the condition of the current change rate $\Delta IM/\Delta t$ and the battery temperature TB, a table of the impedance Z (an impedance table in FIG. 8 described later) is created according to the temperature TB and the current change rate IM/$\Delta t$, to require the impedance Z referring to this table.

The internal impedance Z of the battery increases according as the temperature becomes lower, and the current change rate accordingly becomes smaller. Directly speaking, the impedance Z is determined by using the corrected current change rate TK$\Delta IM/\Delta t$ with the current change rate $\Delta IM/\Delta t$ corrected by the temperature, as mentioned below.

The impedance Z required from the table, the terminal voltage VB measured by the voltage sensor 4, and the current IB measured by the current sensor 5 are applied to the following formula (2) representing the relation with the open-circuit voltage VOC, hence to require the open-circuit voltage VOC.

$$VOC=VB+IB\times Z \quad (2)$$

After the open-circuit voltage VOC is estimated, the reference remaining capacity SOCV is calculated according to the electrochemical relationship within the battery. Specifically, when the relationship between the open-circuit voltage VOC and the reference remaining capacity SOCV is expressed by using the well-known Nernst Equation which describes the relationship between the electrode potential and the ion activity in a state of equilibrium, the following formula (3) can be obtained.

$$VOC=E+[(Rg\times TB/Ne\times F)\times 1nSOVC/(100-SOCV)]+Y \quad (3)$$

Where, E: standard electrode potential (in the lithium-ion battery of this embodiment, E=3.745)
Rg: gas constant (8.314 J/mol–K)
TB: battery temperature (absolute temperature K)

Ne: the number of ions (in the lithium-ion battery of the embodiment, Ne=1)

F: Faraday constant (96485 C/mol)

In the formula (3), Y is a correction factor, representing the quality of voltage-remaining capacity at room temperature by the function of the remaining capacity. When SOCV=X, it can be represented by the cubic function of SOCV, as shown in the following formula (4).

$$Y=-10^{-6}X^3+910^{-5}X^2+0.013X-0.7311 \quad (4)$$

The concrete correlation between the open-circuit voltage VOC and the reference remaining capacity SOCV represented by the above formula (3) varies depending on the type and the quality of a battery, and for example, in a lithium-ion battery, it shows a curve as shown in FIG. 5. The relationship between the open-circuit voltage VOC and the reference remaining capacity SOCV shown in FIG. 5 is a correlation represented by a simple curve in which a change of the reference remaining capacity SOCV never becomes flat as for a change of the open-circuit voltage VOC, and knowing the value of the open-circuit voltage VOC can lead to the clearly understanding of the value of the reference remaining capacity SOCV.

The reference remaining capacity SOCV has a correlation not only to the open-circuit voltage VOC but also to the battery temperature TB, and even when the open-circuit voltage VOC has the same value, as illustrate in FIG. 5, according as the battery temperature TB becomes lower, the reference remaining capacity SOCV decreases. In this case, with the open-circuit voltage VOC and the battery temperature TB as parameters, the reference remaining capacity SOCV can be directly calculated by using the formula (3), actually, however, it is necessary to consider the charge/discharge characteristic inherent in a battery actually used and the using condition.

When the actual battery state is understood from the above formula (3), with the SOCV-VOC characteristic at room temperature as reference, charge/discharge test or simulation in each temperature area is performed and the actual data is accumulated. A table of reference remaining capacity SOCV (reference remaining capacity table of FIG. 9 described later), with the open-circuit voltage VOC and the battery temperature TB as parameters, is created from the accumulated actual data and the reference remaining capacity SOCV is required by using this table.

After the reference remaining capacity SOCV is required, a proportional-integral control is performed with this reference remaining capacity SOCV as the target value. As illustrated in the following formula (5), a capacity difference ESOC(k) between the reference remaining capacity SOCV (K) in a predetermined calculation cycle and the remaining capacity SOC(k−1) in the previous one cycle is calculated.

$$ESOC(k)=SOCV(k)-SOC(k-1) \quad (5)$$

As illustrated in the following formula (6), the proportional correction amount (KP×ESOC) by the proportional coefficient KP and the integral correction amount (KI×SISOC) by the integral coefficient KI are calculated by using the capacity difference ESOC(k) calculated from the formula (5), and the final remaining capacity SOC (k) is calculated by adding the remaining capacity SOCI (k) based on the current integration according to the above formula (1') to these correction amounts.

$$SOC(k)=KP\times ESOC(K)+KI\times SISOC(K)+SOCI(k) \quad (6)$$

Where, SISOC(k)=SISOC(k−1)+ESOC(k)×DLTT

The proportional coefficient KP and the integral coefficient KI are determined considering the stability and the response ability at a load fluctuation, and in a current stable area, the correction amount by the proportional coefficient KP is chiefly used so that the final remaining capacity SOC may have an agreement with the reference remaining capacity SOCV, while in a large current change area, the correction amount by the integral coefficient KI is chiefly used, hence to restrain the influence of the reference remaining capacity SOCV which is easy to change according to the load fluctuation, to secure the stability.

The proportional coefficient KP and the integral coefficient KI can be set by using the parameter which reflects the charge/discharge state of a battery, and the proportional coefficient KP, in particular, can be set by using the current change rate ΔIM/Δt and the battery temperature TB through the above-mentioned moving average. For example, a table is previously created through experiment or simulation based on the current change rate ΔIM/Δt and the battery temperature TB and the proportional coefficient KP can be required referring to this table.

FIG. 6 shows the characteristic of the proportional coefficient KP which varies depending on the current change rate ΔIM/Δt and the battery temperature TB through the moving average. In a stable state where the load fluctuation of the battery is small (ΔIM/Δt is small and the current change is small), the proportional coefficient KP is set at a larger value so that the remaining capacity SOC finally calculated with the larger correction amount based on the capacity difference ESOC may have a good agreement with the reference remaining capacity SOCV of voltage base satisfactorily.

On the contrary, in a state of large load fluctuation (ΔIM/Δt is larger and the current change is greater), the proportional coefficient KP is set smaller so as to restrain the vibration of the reference remaining capacity SOCV and to be able to calculate the remaining capacity of accuracy and of a good response ability also at the load fluctuation. As for the identical current change rate ΔIM/Δt, the proportional coefficient KP is set smaller in order to compensate for an increase in the open-circuit voltage VOC according to a relative increase of the impedance Z, according as the battery temperature TB becomes lower.

This can obtain an accurate remaining capacity SOC, making use of a good point of the reference remaining capacity SOCV based on the open-circuit voltage, grasping the charge/discharge state of the battery more accurately, avoid the accumulation of errors by the current integration, and assure the stability when there occurs a disturbance.

The calculation processing of the remaining capacity SOC through the proportional-integral control on the above reference remaining capacity SOCV will be described by using the flow chart of FIG. 7.

The flow chart of FIG. 7 shows the basic calculation processing of the remaining capacity in the calculation ECU 3 of the power supply unit 1, which is performed in a predetermined time interval (for example, in every 0.1 sec). Upon a start of this processing, at first, in Step S1, data about the terminal voltage VB, the current IB, the temperature TB, and the remaining capacity SOC in the previous one cycle, calculated in the last calculation processing of the battery 2 is read. Assume that the terminal voltage VB is the average of a plurality of battery packs, the current IB is the total sum of the currents of the battery packs, and the both data is taken, for example, in every 0.1 sec. Further, assume that the temperature TB takes data, for example, in every 10 sec.

Proceeding to Step S2, moving average is performed on the current IB, hence to obtain the current change rate ΔIM/Δt per time unit. When the current IB is sampled, for example, in every 0.1 sec and the calculation cycle of current integration is defined as the cycle of 0.5 sec, five data values are taken for the moving average of the current IB. Further, in Step S3, the impedance Z of the battery 2 is calculated referring to the impedance table shown in FIG. 8.

The impedance table in FIG. 8 includes the impedance Z of the equivalent circuit with the corrected current change rate TKΔIM/Δt obtained by correcting the current change rate ΔIM/Δt by the temperature and the temperature TB as parameters, and when the corrected current change rate TKΔIM/Δt is identical, the more the impedance Z increases according as the temperature TB becomes lower, and at the same temperature, the impedance Z is likely to increase according as the corrected current change rate TKΔIM/Δt becomes smaller.

In Step S4 following Step S3, the calculated impedance Z is used to calculate the open-circuit voltage VOC of the battery 2 according to the above formula (2). In Step S5, the reference remaining capacity SOCV is calculated referring to the reference remaining capacity table shown in FIG. 9, with the battery temperature TB and the open-circuit voltage VOC as the parameters.

The reference remaining capacity table shown in FIG. 9 is a table created after understanding the electrochemical state within the battery based on the Nernst Equation, as mentioned above, and schematically, the reference remaining capacity SOCV decreases according as the temperature TB and the open-circuit voltage VOC become lower, while the reference remaining capacity SOCV increases according as the temperature TB and the open-circuit voltage VOC becomes higher. FIGS. 8 and 9 show the data used in the range under the usual condition and the data in the other range is not described here.

Proceeding to Step S6, the battery current IB is added up in every calculation cycle DLTT according to the above formula (1'), and the remaining capacity SOCI is calculated according to the current integration. In Step S7, a capacity difference ESOC between the reference remaining capacity SOCV and the remaining capacity SOC in the previous one control cycle is calculated (refer to the formula (5)), and in Step S8, the proportional correction amount (KP×ESOC) and the integral correction amount (KI×SISOC) are calculated according to the proportional-integral control using the proportional coefficient KP and the integral coefficient KI. In Step S9, according to the above formula (6), the final remaining capacity SOC is calculated and this processing for one cycle is finished.

The above remaining capacity SOC by the proportional-integral control is shown in FIG. 10, together with the reference remaining capacity SOCV based on the open-circuit voltage VOC of the battery and the remaining capacity SOCI with the battery current IB added up. Although the remaining capacity SOCI indicated by the dotted line in FIG. 10 accumulates the current errors and increases a deviation from the reference remaining capacity SOCV, the final remaining capacity SOC makes a good agreement with the reference remaining capacity SOCV while controlling the influence of the vibration of the reference remaining capacity SOCV according to the proportional-integral control, and the favorable calculation accuracy and stability can be obtained.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A remaining capacity calculating device for electric power storage, the device comprising:
   a reference remaining capacity calculating unit that calculates a remaining capacity based on an open-circuit voltage of an electric power storage as a reference remaining capacity;
   a current integration remaining capacity calculating unit that calculates a remaining capacity based on a current integration of the electric power storage as a remaining capacity based on the current integration;
   a capacity difference calculating unit that calculates a capacity difference between the reference remaining capacity calculated by the reference remaining capacity calculating unit and a remaining capacity calculated in a previous cycle as a remaining capacity of the electric power storage;
   a proportional-integral controlling unit that calculates a proportional correction amount and an integral correction amount of a proportional-integral control with the reference remaining capacity as a target value, according to the capacity difference; and
   a remaining capacity calculating unit that calculates a final remaining capacity of the electric power storage, according to the proportional correction amount and the integral correction amount calculated by the proportional-integral controlling unit, and the remaining capacity based on the current integration,
   wherein the proportional-integral controlling unit calculates the proportional correction amount in association with a proportional coefficient of the proportional-integral control based on a current change rate of charge/discharge currents of the electric power storage and the temperature of the electric power storage.

2. The device according to claim 1, wherein the remaining capacity calculating unit adds the remaining capacity based on the current integration of the electric power storage to the proportional correction amount and the integral correction amount, and calculates the final remaining capacity of the electric power storage.

3. The device according to claim 1, wherein the proportional-integral controlling unit calculates the proportional correction amount by multiplying the capacity difference by the proportional coefficient.

4. The device according to claim 1, wherein the proportional coefficient is set larger as the current change rate gets smaller.

5. The device according to claim 1, wherein the proportional coefficient is set smaller as the temperature becomes lower.

6. The device according to claim 1, wherein the final remaining capacity is calculated by determining the proportional coefficient and an integral coefficient of the proportional-integral control so that the proportional correction amount based on the proportional coefficient is chiefly used in a current stable area, and the integral correction amount based on the integral coefficient is chiefly used in a large current change area.

7. The device according to claim 1, wherein the open-circuit voltage is estimated according to an impedance and a terminal voltage of the electric power storage, said impedance is determined based on the temperature of the electric power storage and the current change rate.

8. The device according to claim 1, wherein the current integration remaining capacity calculating unit calculates the remaining capacity based on a current capacity which varies depending on the temperature of the electric power storage.

9. A remaining capacity calculating method for electric power storage, the method comprising:
   calculating a reference remaining capacity based on an open-circuit voltage;
   calculating a remaining capacity based on a current integration of the electric power storage as a remaining capacity based on the current integration;
   calculating a capacity difference between the reference remaining capacity and a remaining capacity calculated in a previous cycle as a remaining capacity of the electric power storage;
   calculating a proportional correction amount and an integral correction amount of a proportional-integral control with the reference remaining capacity as a target value, according to the capacity difference; and
   calculating the final remaining capacity of the electric power storage, according to the proportional correction amount, the integral correction amount, and the remaining capacity based on the current integration,
   wherein the proportional correction amount is calculated in association with a proportional coefficient of the proportional-integral control based on a current change rate of charge/discharge currents of the electric power storage and the temperature of the electric power storage.

10. The method according to claim 9, further comprising: adding the remaining capacity based on the current integration of the electric power storage to the proportional correction amount and the integral correction amount.

11. The method according to claim 9, wherein the proportional correction amount is calculated by multiplying the capacity difference by the proportional coefficient.

12. The method according to claim 9, wherein the proportional coefficient is set larger as the current change rate gets smaller.

13. The method according to claim 9, wherein the proportional coefficient is set smaller as the temperature becomes lower.

14. The method according to claim 9, wherein the final remaining capacity is calculated by determining the proportional coefficient and an integral coefficient of the proportional-integral control so that the proportional correction amount based on the proportional coefficient is chiefly used in a current stable area, and the integral correction amount based on the integral coefficient is chiefly used in a large current change area.

15. The device according to claim 9, wherein the open-circuit voltage is estimated according to an impedance and a terminal voltage of the electric power storage, said impedance is determined based on the temperature of the electric power storage and the current change rate.

16. The device according to claim 9, wherein the remaining capacity based on the current integration is calculated based on.a current capacity which varies depending on the temperature of the electric power storage.

* * * * *